(12) United States Patent
Nakashima et al.

(10) Patent No.: US 9,348,340 B2
(45) Date of Patent: May 24, 2016

(54) LIQUID PROCESSING APPARATUS

(71) Applicant: Tokyo Electron Limited, Tokyo (JP)

(72) Inventors: Mikio Nakashima, Kumamoto (JP);
Shozou Maeda, Kumamoto (JP);
Yuusuke Takamatsu, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 14/456,319

(22) Filed: Aug. 11, 2014

(65) Prior Publication Data

US 2015/0053285 A1    Feb. 26, 2015

(30) Foreign Application Priority Data

Aug. 23, 2013    (JP) .................................. 2013-173759

(51) Int. Cl.
*G05D 11/00*    (2006.01)
*G05D 7/06*    (2006.01)
*H01L 21/67*    (2006.01)

(52) U.S. Cl.
CPC ........ *G05D 7/0664* (2013.01); *H01L 21/67017* (2013.01); *Y10T 137/85986* (2015.04)

(58) Field of Classification Search
CPC ........... H01L 21/67017; G05D 7/0664; Y10T 137/85986
USPC ........... 137/565.11, 565.27, 486, 111, 599.05
See application file for complete search history.

(56) References Cited

U.S. PATENT DOCUMENTS

2010/0310765 A1* 12/2010 Olsson ................ B05C 11/1013
427/207.1
2011/0023909 A1*  2/2011 Ito ..................... H01L 21/67051
134/18

FOREIGN PATENT DOCUMENTS

JP            3841945 B      11/2006
JP        2011-035135 A      2/2011

* cited by examiner

*Primary Examiner* — John K Fristoe, Jr.
*Assistant Examiner* — Umashankar Venkatesan
(74) *Attorney, Agent, or Firm* — Abelman, Frayne & Schwab

(57) ABSTRACT

A liquid processing apparatus includes a first line to which a processing liquid pressurized by a pump is sent from a processing liquid supply source; a plurality of second lines into which the pressurized processing liquid flowing through the first line flows; a branch line connected to a branch point on each of the second lines; a liquid processing unit configured to process a substrate with the processing liquid; an orifice provided at an upstream side of the branch point; and a first control valve provided at a downstream side of the branch point. The first control valve changes an amount of the processing liquid flowing to a downstream side of the first control valve to control a pressure of the processing liquid in a section between the orifice of the second line and the first control valve, and to control a flow rate of the processing liquid.

4 Claims, 3 Drawing Sheets

LIQUID PROCESSING APPARATUS

CROSS-REFERENCE TO RELATED APPLICATIONS

This application is based on and claims priority from Japanese Patent Application No. 2013-173759, filed on Aug. 23, 2013 with the Japan Patent Office, the disclosure of which is incorporated herein in its entirety by reference.

TECHNICAL FIELD

The present disclosure relates to a technique for controlling a flow rate of a processing liquid supplied to a liquid processing unit in a liquid processing apparatus in which a predetermined liquid processing is performed on a substrate.

BACKGROUND

In manufacturing semiconductor devices, a liquid processing such as, for example, a cleaning processing or a wet etching processing is performed on a substrate such as a semiconductor wafer. In order to perform such a liquid processing, a liquid processing system provided with a plurality of liquid processing modules (liquid processing units) is used. The liquid processing system is provided with a processing liquid storing tank, a circulation line that goes out of the processing liquid storing tank and goes back to the processing liquid storing tank, and a pump configured to form a flow of a pressurized processing liquid in the circulation line. A plurality of branch lines branches in parallel from the circulation line, and the processing liquid is supplied to each of the liquid processing modules from the branch lines. A flowmeter and a flow control valve are interposed in each of the branch lines. Based on a detection value of the flowmeter, a feedback control of the flow control valve is performed such that a flow rate of the processing liquid supplied to a substrate by the liquid processing module becomes a desired value (see, for example, Japanese Patent No. 3841945).

When a valve body of the flow control valve is moved frequently in the feedback control, particles may be generated inside the flow control valve. The generated particles are supplied to a substrate along with the processing liquid passing through the branch lines. Here, when the particles are generated at a problematic level, it is necessary to provide a filter to remove the particles. However, provision of a filter causes a problem in that a regular maintenance of the filter is required.

SUMMARY

In a suitable exemplary embodiment, the present disclosure provides a liquid processing apparatus including: a first line connected to a processing liquid supply source; a pump configured to send a processing liquid from the processing liquid supply source to the first line; a plurality of second lines connected to the first line; a branch line connected to a branch point on each of the plurality of second lines; a liquid processing unit configured to perform a liquid processing on a substrate with the processing liquid supplied through each branch line; an orifice provided at an upstream side of the branch point on each of the plurality of second lines; and a first control valve provided at a downstream side of the branch point on each of the plurality of second lines. The first control valve changes an amount of the processing liquid flowing to a downstream side of the first control valve to control a pressure of the processing liquid in a section between the orifice of a corresponding second line and the first control valve, and to control a flow rate of the processing liquid supplied to the corresponding liquid processing unit through the corresponding branch line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
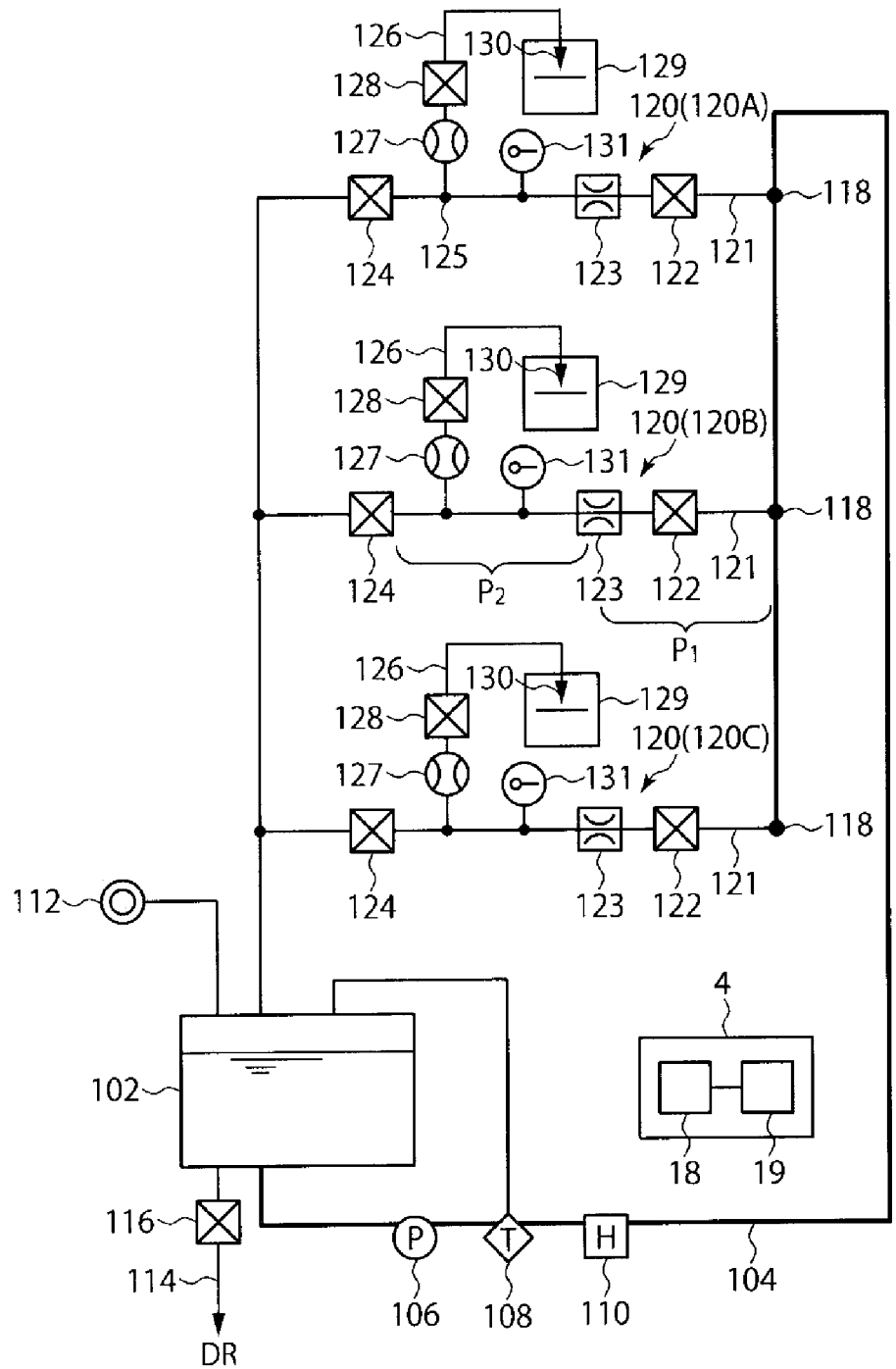
FIG. 1 is a view illustrating a processing liquid circuit of a liquid processing apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a liquid processing apparatus in which particles that may be generated from a control valve for flow control of a processing liquid supplied to a liquid processing unit is not supplied to the liquid processing unit.

In a suitable exemplary embodiment, the present disclosure provides a liquid processing apparatus including: a first line connected to a processing liquid supply source; a pump configured to send a processing liquid from the processing liquid supply source to the first line; a plurality of second lines connected to the first line; a branch line connected to a branch point on each of the plurality of second lines; a liquid processing unit configured to perform a liquid processing on a substrate with the processing liquid supplied through each branch line; an orifice provided at an upstream side of the branch point on each of the plurality of second lines; and a first control valve provided at a downstream side of the branch point on each of the plurality of second lines. The first control valve changes an amount of the processing liquid flowing to a downstream side of the first control valve to control a pressure of the processing liquid in a section between the orifice of a corresponding second line and the first control valve, and to control a flow rate of the processing liquid supplied to the corresponding liquid processing unit through the corresponding branch line.

The above-described liquid processing apparatus may further include a flowmeter provided on each of the branch lines; and a control unit configured to control the corresponding first control valve based on a flow rate detected by the flowmeter to control the flow rate of the processing liquid flowing through the corresponding branch line.

In the above-described liquid processing apparatus, the processing liquid supply source is a tank configured to store the processing liquid, and a portion at the downstream side of the branch point of each of the second line is communicated with the tank.

In the above-described liquid processing apparatus, the processing liquid supply source is a tank configured to store the processing liquid, and the first line is formed as a circulation line which goes out of the tank and goes back to the tank.

In the above-described liquid processing apparatus, a second control valve is provided in the first line at a downstream side of a connection point to the first line of the second line which is connected to the first line at the most downstream side of the first line such that the second control valve changes an amount of the processing liquid flowing to a downstream side of the second control valve to control a pressure in the first line at an upstream side of the second control valve.

According to the present disclosure, since it is not necessary to interpose a control valve for flow control in the branch line, particles that may be generated from such a control valve do not flow in the liquid processing unit.

Hereinafter, exemplary embodiments of the present disclosure will be described with reference to the accompanying drawings. A first exemplary embodiment will be first described.

A liquid processing apparatus is provided with a tank 102 serving as a processing liquid supply source. The processing liquid tank 102 is connected with a main line (first line) 104. The main line 104 is provided with a pump 106, a filter 108, and a heater 110 in this order from an upstream side thereof. The pump 106 sends a processing liquid, which is stored in the tank 102, in a pressurized state towards a downstream side of the main line 104. The filter 108 removes contaminants such as particles from the processing liquid. The heater 110 heats the processing liquid to a predetermined temperature. When the processing liquid is used at a normal temperature, the heater 110 may not be provided. The tank 102 is replenished with a processing liquid or a processing liquid component from a replenishment device 112, as necessary. The processing liquid in the tank 102 may be drained through a drain line 114 provided with an opening/closing valve 116. For convenience of explanation, the "main line (first line)" is used to refer to a portion indicated by a bold line.

At a plurality of connection points 118 set on the main line 104, the main line 104 is connected with a plurality of subsidiary lines (second lines) 121. Downstream ends of the plurality of subsidiary lines 121 are connected to the tank 102.

In the exemplary embodiment illustrated in FIG. 1, the downstream ends of the plurality of subsidiary lines 121 are joined with each other and then connected to the tank 102. However, the downstream ends of the plurality of subsidiary lines 121 may be connected to the tank 102 separately.

One subsidiary line 121 is provided with an opening/closing valve 122, an orifice 123, and a first control valve 124 (to be described later in detail) sequentially from an upstream side thereof. At a branch point 125 set in a downstream side of the orifice 123 of the subsidiary line 121 and in an upstream side of the first control valve 124, the subsidiary line 121 is connected with a branch line 126. The branch line 126 is provided with a flowmeter 127 and an opening/closing valve 128 sequentially from an upstream side thereof. Downstream ends of the branch line 126 is connected with a processing liquid nozzle 130 provided in a liquid processing unit 129 (also referred to as a 'liquid processing module'). The subsidiary line 121 is provided with a thermometer 131 between the orifice 123 and the branch point 125.

The liquid processing unit 129 is configured to perform a predetermined processing on a substrate such as a semiconductor wafer by supplying the processing liquid from the processing liquid nozzle 130 to the substrate. The liquid processing unit 129 includes, for example, a spin chuck (not illustrated) configured to hold and rotate the substrate, and a receiving cup (not illustrated) surrounding the periphery of the substrate to receive the processing liquid scattered from the substrate.

Components provided in connection with each subsidiary line 121 (the members represented by reference numerals 121 to 130) are the same as each other. A set of the components 121 to 130 associated with each subsidiary line 121 is represented by a reference numeral 120.

The first control valve 124 may be a valve of any type having a function to change an amount of the processing liquid flowing to an outlet (downstream side) of the first control valve 124 such that a pressure at an inlet (upstream side) thereof is maintained at a predetermined target pressure. The first control valve 124 may be, for example, a back pressure valve.

The liquid processing apparatus is provided with a control device 4. The control device 4 is, for example, a computer, and includes a control unit 18 and a storage unit 19. The storage unit 19 stores a program that controls various processings performed in the liquid processing apparatus. The control unit 18 controls the operations of the liquid processing apparatus by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

Figure 2:
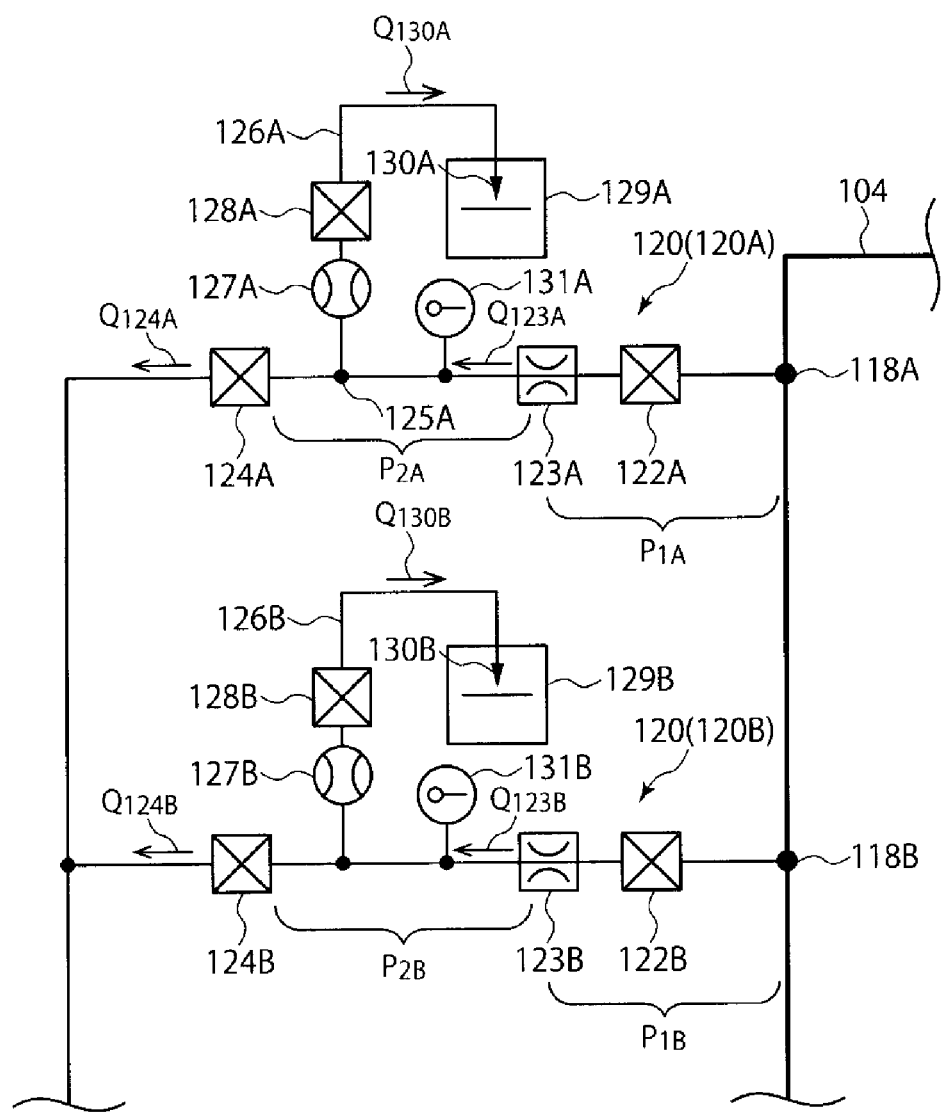
FIG. 2 is a view for explaining an operation of the first exemplary embodiment.

Next, actions will be described with reference to FIG. 2. In the following, in order to distinguish the same elements belonging to different sets, symbols 'A', 'B', and 'C' will be accompanied to the ends of the reference numerals as necessary. FIG. 2 illustrates only a part related to component sets 120A, 120B, which is extracted from the processing liquid circuit illustrated in FIG. 1. Here, it is assumed that the same liquid processing is performed on a substrate in each of liquid processing units 129A, 129B. The opening/closing valve 122 is always opened during normal operation of the liquid processing apparatus, and is closed only in a special case such as maintenance.

Here, a pressure $P_{1A}$ at an upstream side of an orifice 123A of a subsidiary line 121A is set to 140 kPa. Further, a pressure $P_{1B}$ at an upstream side of an orifice 123B of a subsidiary line 121B is set to 150 kPa. Such a difference between the pressure $P_{1A}$ and the pressure $P_{1B}$ is generated, for example, due to a difference in water head near connection points 118A, 118B, which is caused by a difference between heights where the liquid processing units 129A, 129B are provided.

Target flow rates $Q_{130A}$, $Q_{130B}$ of the processing liquids ejected from processing nozzles 130A, 130B of the liquid processing units 129A, 129B are set to be the same and constant, respectively. Here, for example, the target flow rates $Q_{130A}$, $Q_{130B}$ are set to be $Q_{130A}=Q_{130B}=2.5$ L/min In the example as illustrated, variable flow adjusting units are not provided on branch lines 126A, 12B of the respective sets 120A, 120B. Accordingly, the flow rates of the processing liquids ejected from the processing nozzles 130A, 130B monotonically increase (decrease) in accordance with an increase (decrease) in pressures $P_{2A}$, $P_{2B}$ of regions between orifices 123A, 123B and first control valves 124A, 124B in the subsidiary lines 121A, 121B, respectively.

The pressure $P_{2A}$ and the pressure $P_{2B}$ required to realize $Q_{130A}=Q_{130B}=2.5$ L/min, that is, target pressures are the same as each other. Here, the target pressures are set to 100 kPa. In this case, a pressure drop of 140−100=40 kPa may occur in the orifice 123A. In addition, a pressure drop of 150−100=50 kPa may occur in the orifice 123B. Differences in pressure between inlets and outlets of the orifices 123A, 123B, $P_{1A}$-$P_{2A}$, $P_{1B}$-$P_{2B}$, monotonically increase (decrease) in accordance with an increase (decrease) in flow rates $Q_{123A}$, $Q_{123B}$ of the processing liquids passing through the orifices 123A, 123B. As differences between the actual pressures $P_{2A}$, $P_{2B}$ and the target pressure (100 kPa) increase, the flow rates $Q_{124A}$, $Q_{124B}$ of the processing liquid passing through the first control valves 124A, 124B configured as back pressure valves increase. And, since the flow rates $Q_{124A}$, $Q_{124B}$ increase, flow rates $Q_{123A}$, $Q_{123B}$ also increase. Accordingly, the pressure $P_{2A}$ and the pressure $P_{2B}$ automatically converge to the target pressure. Various values described in FIG. 2 are those obtained after the pressure $P_{2A}$ and the pressure $P_{2B}$ automatically converge to 100 kPa which is the target pressure. For example, the flow rate $Q_{124A}$ is equal to 0.5 L/min, the flow rate $Q_{124B}$ is equal to 1.0 L/min, the flow rate $Q_{123A}$ is equal to 3.0 L/min, and the flow rate $Q_{123B}$ is equal to 3.5 L/min.

As described above, cooperative actions of the orifices 123A, 123B and the first control valve 124 formed as a back pressure valve allow the pressure $P_{2A}$ and the pressure $P_{2B}$ to be maintained at the target pressure, and the flow rates of the processing liquids supplied from the processing nozzles 130A, 130B to be controlled to be the target flow rate.

The processing liquids passing through the first control valves 124A, 124B are returned to the tank 102, and sent again from the tank 102 to the main line 104.

When it is not necessary to supply the processing liquid to the liquid processing unit 129, particularly, for example, when the liquid processing unit 129 does not perform a liquid processing (e.g., when performing a processing using a processing liquid supplied from another processing liquid circuit, when drying the substrate, or when exchanging the substrate), the opening/closing valve 128 of one of the component sets 120A to 120C to which the liquid processing unit 129 belongs, may be closed. Then, the processing liquid does not flow through the processing nozzle 130. Instead, an amount of the processing liquid flowing through the first control valve 124 increases substantially by that amount. For example, in the example illustrated in FIG. 2, when the opening/closing valve 128A of the component set 120A is closed, the processing liquid does not flow through the processing nozzle 130A. Instead, an amount of the processing liquid flowing through the first control valve 124A increases substantially by that amount. Thus, the amount of the processing liquid becomes about 3.0 L/min. Further, in this case, the pressure between the orifice 123A and the first control valve 124A is also maintained at the above-mentioned target pressure (100 kPa) by the first control valve 124A formed as a back pressure valve.

As is clear from the above, the amount of the processing liquid flowing into the subsidiary line 121 from the main line 104 becomes substantially the same, regardless of whether or not the processing liquid is supplied to the liquid processing unit 129 belonging to any one of the component sets 120A to 120A. Therefore, since it is not necessary to change the amount of the processing liquid to be sent to the main line 104 by the pump 102 depending on the operation state of the processing unit 129 of each of the component sets 120A to 120C, the pump 102 may be stably operated. Further, although descriptions for the actions related to the component set 120C are omitted, it is of course that the component set 120C acts in the same manner as the component sets 120A, 120B.

In the exemplary embodiment described above, the first control valve 124 is a back pressure valve, but, instead of that, the first control valve 124 may serve as a variable throttle valve. In this case, the degree of opening of the variable throttle valve 124 may be feedback-controlled through, for example, the control device 4 by providing a pressure gauge (not illustrated) configured to measure a pressure $P_2$ in a section between the variable throttle valve 124 and the orifice 123 in the subsidiary line 121, such that the detected pressure of the pressure gauge reaches a target value (for example, 100 kPa as described above).

Alternatively, based on a detected flow rate of the flowmeter 127, the flow rate of the processing liquid supplied from the processing liquid nozzle 130 may be controlled to be the target flow rate by adjusting the degree of opening of the variable throttle valve 124 such that the detected flow rate reaches a target value (for example, 2.5 L/min as described above) through, for example, the control device 4. In principle, the performance in this case is exactly the same as in the exemplary embodiment as described above. That is, when the pressure $P_2$ is higher (lower) than the target pressure, the detected flow rate of the flowmeter 127 becomes higher (lower) than the target flow rate. Therefore, in this case, when the degree of opening of the variable throttle valve 124 increases (decreases), the flow rate of the processing liquid passing through the variable throttle valve increases (decreases), and hence, the flow rate of the processing liquid passing through the orifice 123A increases (decreases). As a result, the pressure $P_2$ converges to the target pressure.

However, in this case, when the liquid processing unit 129 belonging to a component set to which the variable throttle valve 124 belongs does not perform a liquid processing on a substrate, it may be desirable to maintain the amount of the processing liquid flowing through the subsidiary line 121 belonging to the component set at a substantially constant target flow rate. In such a case, for example, it is necessary to take the following measures. As a first measure, a flowmeter is provided on the subsidiary line 121, and the degree of opening of the variable throttle valve 124 is feedback-controlled through, for example, the control device 4 such that a detected value of the flowmeter reaches the target flow rate. As a second measure, (although some variation may occur in the flow rate) when the liquid processing unit 129 belonging to a component set to which the variable throttle valve 124 belongs does not perform a liquid processing on a substrate, a command that causes the variable throttle valve 124 to be in a predetermined degree of opening is assigned to the variable throttle valve 124 from the control device 4.

Further, as described above, in a case where a variable throttle valve (which may be a back pressure valve capable of varying a primary target pressure by an electric control) is employed as the first control valve 124, when a heated processing liquid is used, a temperature adjustment of a subsidiary line 121 may be performed by adjusting a flow rate of the processing liquid flowing through a subsidiary line 121 when the processing liquid is not supplied to a liquid processing unit 129 belonging to any one of the component sets 120A to 120C to which the subsidiary line 121 belongs. In this case, when a temperature measured by the thermometer 131 is lower (higher) than a predetermined value, the flow rate of the processing liquid flowing through the subsidiary line 121 increases (decreases) by adjusting the degree of opening of the variable throttle valve 124 through, for example, the control device 4.

Figure 3:
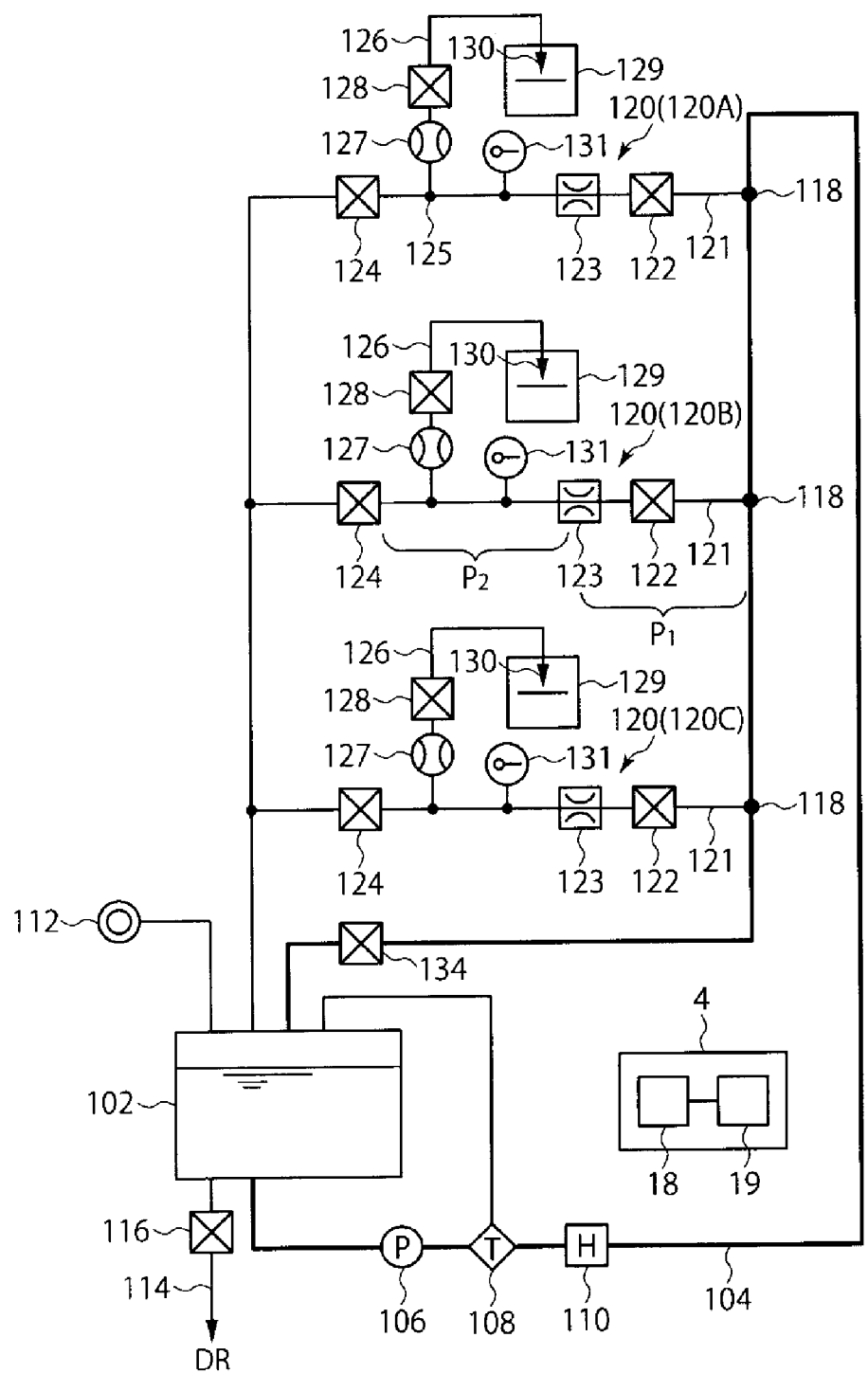
FIG. 3 is a view illustrating a processing liquid circuit of a liquid processing apparatus according to a second exemplary embodiment.

In another exemplary embodiment, as illustrated in FIG. 3, the main line 104 may be formed as a circulation line departing from the tank 102 and returning to the tank 102. In this case, a second control valve 134 may be provided at a downstream side of the connection point 118 to the main line 104 of the subsidiary line 121 which is connected to the main line 104 at the most downstream side of the main line 104. The second control valve 134 has a function to adjust a pressure in the main line 104 at an upstream side of the second control valve 134 by changing an amount of the processing liquid flowing to a downstream side of the second control valve 13. The second control valve 134 may be, for example, a back pressure valve, and maintains, for example, the pressure in the main line 104 at an inlet of the back pressure valve at 150 kPa. The second control valve 134 may be a variable throttle valve. According to the configuration as illustrated in FIG. 3, the second control valve 134 may further stabilize the pressure in the main line 104.

The exemplary embodiments of the present disclosure have been described, but the present disclosure is not limited to the exemplary embodiments. For example, the substrate may be any substrate such as, for example, a glass substrate or a ceramic substrate, other than the semiconductor wafer. The number of component sets is not limited to three (3) as illustrated, and may be any number of one or more.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a first line connected to a processing liquid supply source;
a pump configured to send a processing liquid from the processing liquid supply source to the first line;
a plurality of second lines connected to the first line;
a branch line connected to a branch point on each of the plurality of second lines;
a liquid processing unit configured to perform a liquid processing on a substrate with the processing liquid supplied through each branch line;
an orifice provided at an upstream side of the branch point on each of the plurality of second lines;
a first control valve provided at a downstream side of the branch point on each of the plurality of second lines;
a flowmeter provided on each of the branch lines; and
a control unit configured to control a corresponding first control valve based on a flow rate detected by the flowmeter to control the flow rate of the processing liquid flowing through a corresponding branch line,
wherein the first control valve changes an amount of the processing liquid flowing to a downstream side of the first control valve in order to control a pressure of the processing liquid in a section between the orifice of a corresponding second line and the first control valve, and a flow rate of the processing liquid supplied to the corresponding liquid processing unit through the corresponding branch line.

2. The liquid processing apparatus of claim 1, wherein the processing liquid supply source is a tank configured to store the processing liquid, and a portion at the downstream side of the branch point of each of the plurality of second lines is communicated with the tank.

3. The liquid processing apparatus of claim 1, wherein the processing liquid supply source is a tank configured to store the processing liquid, and the first line is formed as a circulation line which goes out of the tank and goes back to the tank.

4. The liquid processing apparatus of claim 3, wherein a second control valve is provided in the first line at a downstream side of a connection point to the first line of each of the second lines which is connected to the first line at the most downstream side of the first line such that the second control valve changes an amount of the processing liquid flowing to a downstream side of the second control valve to control a pressure in the first line at an upstream side of the second control valve.

* * * * *